US011800664B2

(12) United States Patent
Lai et al.

(10) Patent No.: US 11,800,664 B2
(45) Date of Patent: Oct. 24, 2023

(54) WEARABLE DEVICE

(71) Applicant: Quanta Computer Inc., Taoyuan (TW)

(72) Inventors: Shan-Peng Lai, Taoyuan (TW); Cheng-Wei Wu, Taoyuan (TW); Chun-Lung Chen, Taoyuan (TW); Heng-Min Hu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/584,768

(22) Filed: Jan. 26, 2022

(65) Prior Publication Data

US 2023/0164933 A1 May 25, 2023

(30) Foreign Application Priority Data

Nov. 25, 2021 (TW) .................................. 110213955

(51) Int. Cl.
*H05K 5/02* (2006.01)
*H05K 5/00* (2006.01)

(52) U.S. Cl.
CPC ......... *H05K 5/0217* (2013.01); *H05K 5/0086* (2013.01)

(58) Field of Classification Search
CPC ..... H05K 5/0217; H05K 5/0086; G06F 1/163
See application file for complete search history.

(56) References Cited

U.S. PATENT DOCUMENTS

| | | | |
|---|---|---|---|
| 8,577,427 B2* | 11/2013 | Serota | H04R 1/105 379/430 |
| 10,289,157 B2* | 5/2019 | Chen | G06F 1/1637 |
| 10,408,313 B1* | 9/2019 | Sullivan | F16H 19/06 |
| 10,617,025 B1* | 4/2020 | Chen | H05K 5/0217 |
| 2012/0068914 A1* | 3/2012 | Jacobsen | G06F 1/163 345/8 |
| 2016/0077337 A1* | 3/2016 | Raffle | G02B 27/017 345/156 |
| 2018/0011326 A1* | 1/2018 | Ishizaki | G02B 27/0172 |
| 2018/0027676 A1* | 1/2018 | Araki | H04N 5/7491 361/679.01 |
| 2018/0295733 A1* | 10/2018 | Wen | H05K 5/0086 |
| 2018/0308397 A1* | 10/2018 | Sugimoto | G02B 27/017 |
| 2019/0159354 A1* | 5/2019 | Zheng | A42B 1/24 |
| 2019/0280416 A1* | 9/2019 | Zhang | H01R 13/422 |
| 2019/0293947 A1* | 9/2019 | Ma | G02B 27/0172 |
| 2020/0213708 A1* | 7/2020 | Wang | H04R 1/1066 |
| 2021/0216099 A1* | 7/2021 | Goodner | G02B 27/0176 |
| 2021/0315301 A1* | 10/2021 | Wang | A41D 20/00 |
| 2021/0381639 A1* | 12/2021 | Howard | G06F 1/163 |

* cited by examiner

*Primary Examiner* — Sagar Shrestha
(74) *Attorney, Agent, or Firm* — McClure, Qualey & Rodack, LLP (57) ABSTRACT

A wearable device, which is worn on a user's head, includes a front assembly, a rear assembly, and a connecting assembly. The connecting assembly connects the front assembly and the rear assembly, wherein the front assembly may be rotated by an angle relative to the rear assembly via the connecting assembly.

8 Claims, 7 Drawing Sheets

FIG. 7 though the rear accommodating portion, the elastic element, the engaging element, and the front accommodating portion to be locked into the pressing element.

According to some embodiments of the present disclosure, the front assembly includes an inner wall and the rear assembly includes a stopper.

WEARABLE DEVICE

CROSS-REFERENCE TO RELATED APPLICATIONS

The present application claims priority of Taiwan Patent Application No. 110213955, filed 25 Nov. 2021, which is incorporated by reference herein in its entirety.

BACKGROUND OF THE DISCLOSURE

Field of the Disclosure

The present invention relates to a wearable device.

Description of the Related Art

In a situation that the angle of the conventional wearable devices with augmented reality (AR) technology cannot be adjusted, or when a user wearing the conventional wearable device need to work with his head down, the user's viewing angle is often not the same as the viewing angle of the camera lens of the optical module. Hence, the virtual image and the real image may not be superimposed and a good augmented reality effect may not be achieved.

BRIEF SUMMARY OF THE DISCLOSURE

Therefore, in the present embodiments, a wearable device is provided, and the user can simply adjust a relative angle between the user's viewing angle and the optical module, so that the virtual image and the real image are superimposed to achieve the good augmented reality effect.

An embodiment of the invention provides a wearable device, worn on a user's head, includes a front assembly, a rear assembly, and a connecting assembly. The connecting assembly connects the front assembly and the rear assembly, wherein the front assembly is rotatable to an angle relative to the rear assembly via the connecting assembly.

According to some embodiments of the present disclosure, the front assembly includes a first fan-shaped portion, and the connecting assembly includes an engaging element, wherein the engaging element and the first fan-shaped portion are engaged with each other. The front assembly has a plurality of first teeth, the first teeth are arranged to form the first fan-shaped portion, wherein the engaging element has a plurality of second teeth, the second teeth are arranged to form a second fan-shaped portion, and the first teeth are inserted into gaps between the second teeth to be engaged with each other. The first fan-shaped portion has a first angle, the second fan-shaped portion has a second angle, and the first angle is smaller than the second angle. The second angle is twice the first angle.

According to some embodiments of the present disclosure, the front assembly further includes a front accommodating portion, the rear assembly includes a rear accommodating portion, and the front accommodating portion and the rear accommodating portion respectively accommodate a part of the engaging element. The connecting assembly further includes at least one elastic element, disposed on the rear accommodating portion, connecting the engaging element and the rear assembly. The connecting assembly further includes a pressing element, and the front assembly further includes a front receiving portion, wherein the front receiving portion and the front accommodating portion are communicated by a through hole, and the pressing element is disposed on the front receiving portion. The connecting assembly further includes a fixing element, wherein the rear assembly further includes a rear receiving portion, and the fixing element sequentially passes through the rear accommodating portion, the elastic element, the engaging element, and the front accommodating portion to be locked into the pressing element.

BRIEF DESCRIPTION OF THE DRAWINGS

Aspects of this disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

In the following detailed description, for the purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept can be embodied in various forms without being limited to those exemplary embodiments. In addition, the drawings of different embodiments can use like and/or corresponding numerals to denote like and/or corresponding elements in order to clearly describe the present disclosure. However, the use of like and/or corresponding numerals in the drawings of different embodiments does not suggest any correlation between different embodiments. The directional terms, such as "up", "down", "left", "right", "front" or "rear", are reference directions for accompanying drawings. Therefore, using the directional terms is for description instead of limiting the disclosure.

It should be understood that when an element is referred to as being "connected to" or "coupled to" another element, the element may be directly connected or coupled to another element, or there are one or more elements between the two elements. In addition, the use of ordinal numbers such as first, second, and third does not necessarily imply a sense of order, but can be multiple instances to distinguish actions or structures.

Reference to "one embodiment" or "an embodiment" throughout the specification means that particular features, structures, or characteristics described in conjunction with the embodiment are included in at least one embodiment. Therefore, the sentences "in one embodiment" or "in an embodiment" appearing in various places throughout the specification do not necessarily all refer to the same embodiment. In addition, in one or more embodiments, specific features, structures, or characteristics may be combined in any suitable manner.

Figure 1:
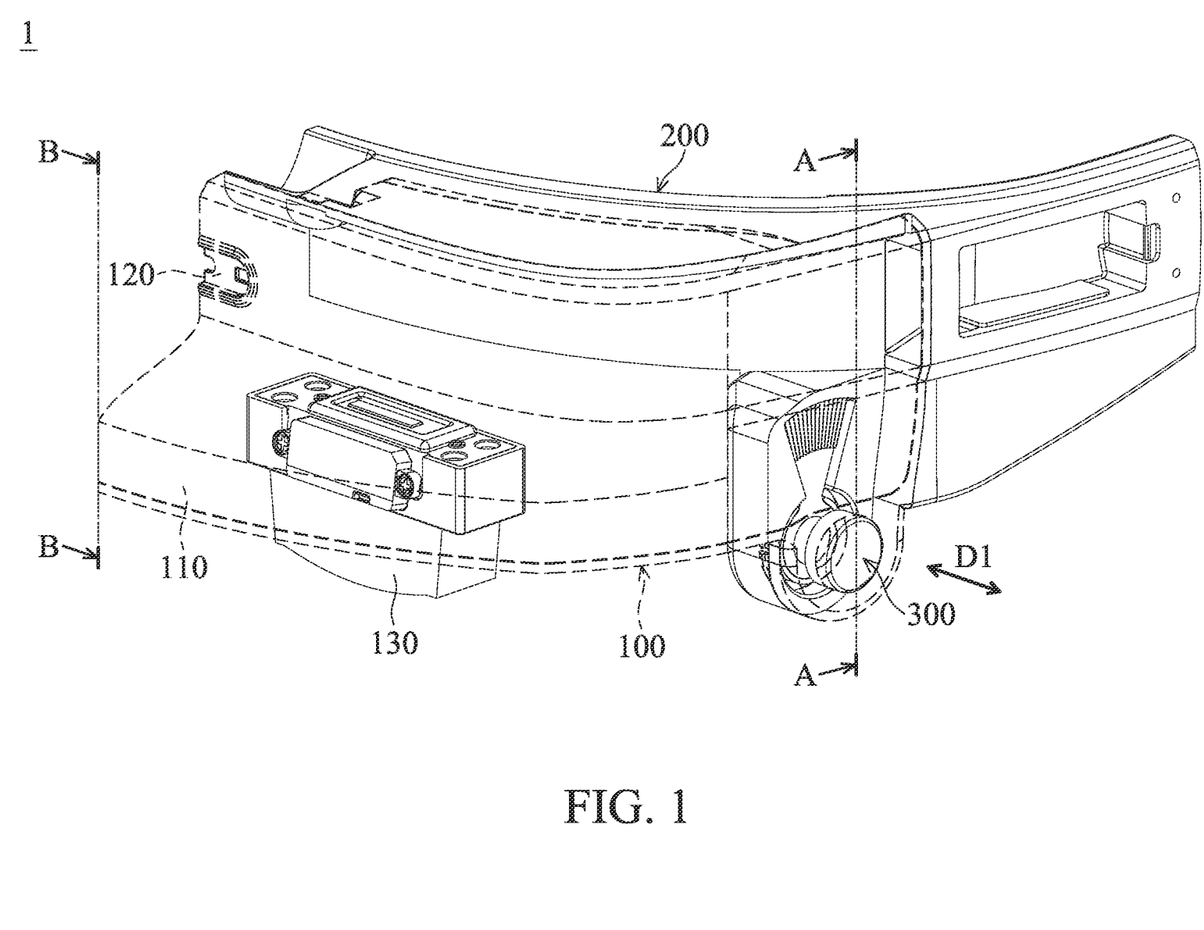
FIG. 1 is a perspective view of a partial structure of a wearable device according to an embodiment of the present disclosure.
Figure 2:
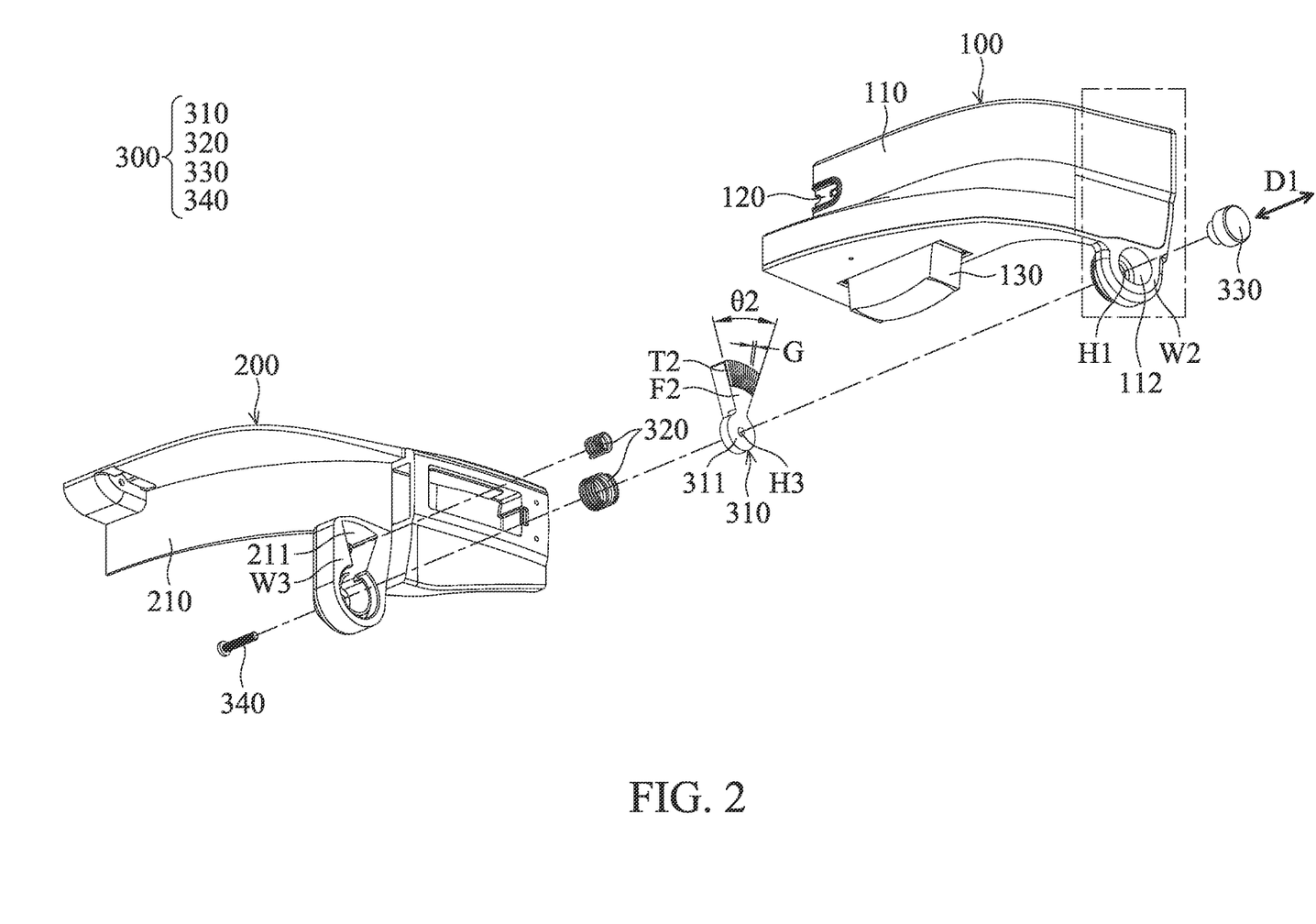
FIG. 2 is an exploded view of a partial structure of a wearable device according to an embodiment of the present disclosure.
Figure 3:
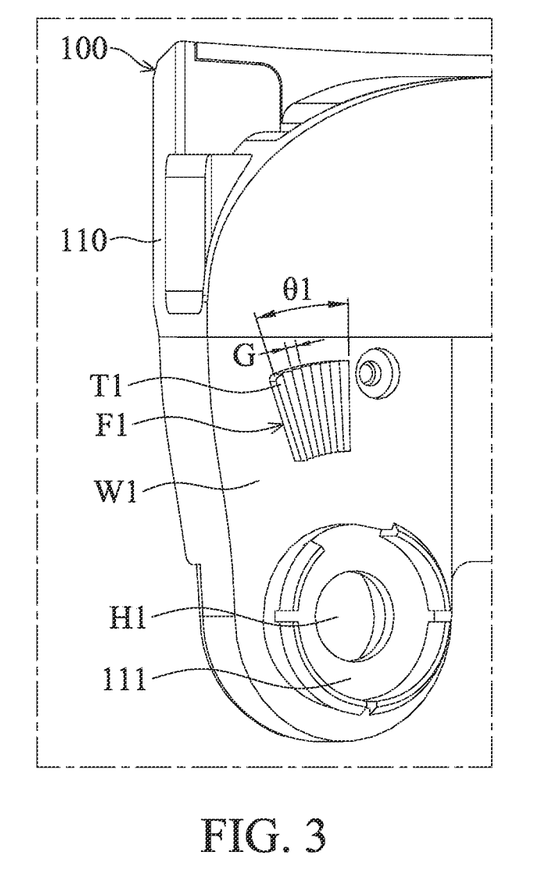
FIG. 3 is an enlarged schematic view of the part framed by the dotted line in FIG. 2 from another angle.
Figure 4:
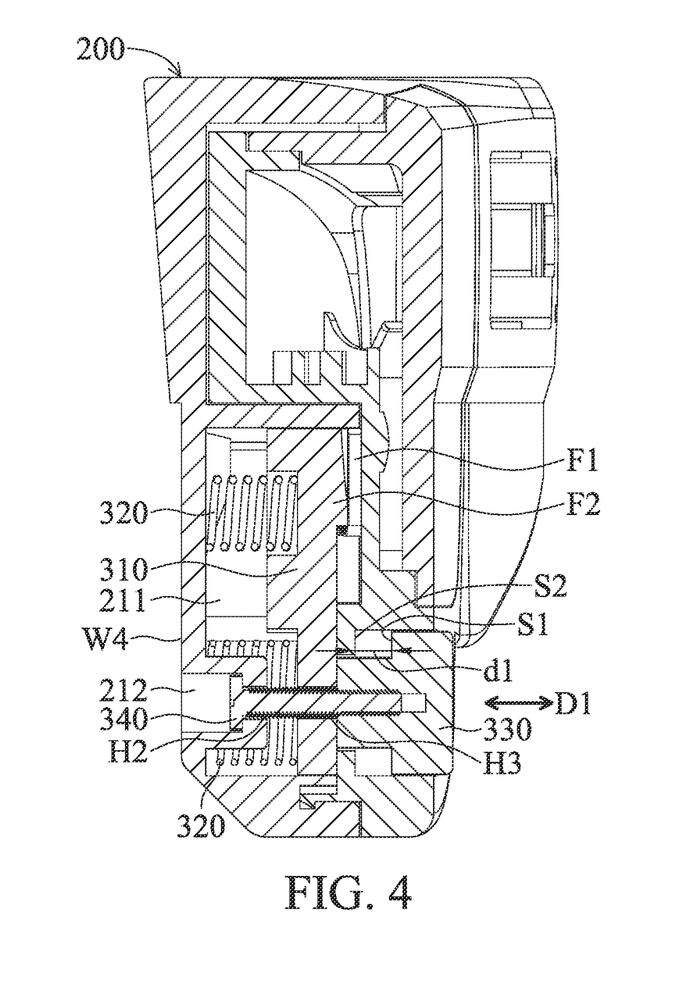
FIG. 4 is a cross-sectional view of a partial structure of the wearable device cut along the line A-A' in FIG. 1.

First, refer to FIGS. 1 to 4. FIG. 1 is a perspective view of a partial structure a wearable device 1 according to an embodiment of the present disclosure, wherein some assemblies are shown as transparent by dashed lines for clearly illustrating main elements of the wearable device 1. FIG. 2 is an exploded view of a partial structure of the wearable device 1 according to an embodiment of the disclosure. FIG. 3 is an enlarged schematic view of the part framed by the dotted line in FIG. 2 from another angle. FIG. 4 is a cross-sectional view of the wearable device 1 cut along the line A-A' in FIG. 1. It should be noted that, in FIGS. 1 to 4, for clear description, only a partial structure of the wearable device 1 corresponding to a user's left eye is shown, and the unshown right eye part may be symmetrical or similar structure. The wearable device 1 may be worn on the user's head, so that the user may use it to perform an application of augmented reality technology. The wearable device 1 includes a front assembly 100, a rear assembly 200, and a connecting assembly 300. The connecting assembly 300 connects the front assembly 100 and the rear assembly 200. When viewed along a first direction D1, the rear assembly 200 is closer to the user's head than the front assembly 100.

The front assembly 100 may include an outer cover 110, an image capturing portion 120, and an optical machine 130. The image capturing portion 120 and the optical machine 130 are disposed on the outer cover 110. A first fan-shaped portion F1 and a front accommodating portion 111 are disposed on a side wall W1 (refer to FIG. 3) of the outer cover 110 for engaging and accommodating a part of the connecting assembly 300, and the side wall W1 is not parallel to the first direction D1 and is close to the rear assembly 200. A front receiving portion 112 is disposed on a side wall W2 (refer to FIG. 2) opposite to the side wall W1 to receive a part of the connecting assembly 300.

The first fan-shaped portion F1 includes a plurality of first teeth T1. In more detail, there is gap G between each of the plurality of first teeth T1 and the adjacent one, and the plurality of first teeth T1 are arranged to form a first fan-shaped portion F1. The front accommodating portion 111 is disposed adjacent to the first fan-shaped portion F1, and the front accommodating portion 111 has a circular groove shape and a through hole H1. The front accommodating portion 111 and the front receiving portion 112 are communicated by the through hole H1.

The image capturing portion 120 may capture external images. In addition, the image capturing portion 120 may also include a camera, GPS, wireless positioning, etc., configured to detect the spatial position. The optical machine 130 may include, for example, a liquid crystal display (LCD), a light-emitting diode (LED) display (such as an OLED display or a Micro LED display), or other similar devices, to project images on the user's eyes.

The rear assembly 200 includes a frame 210 and a wearing fixing portion (not shown). Two sides of the frame 210 may extend backward along the user's head to be connected with the wearing fixing portion. In FIGS. 1 to 4, although the wearing fixing portion is not shown, the wearing fixing portion may be fixed to the user's head in a form like a glasses frame or a headband (refer to FIGS. 5 and 6), and does not limit to this.

A rear accommodating portion 211 is disposed on the a side wall W3 (refer to FIG. 2) of frame 210 to correspond to the front accommodating portion 111 and receiving a part of the connecting assembly 300, and the side wall W3 is not parallel to the first direction D1 and is close to the front assembly 100. A rear receiving portion 212 (refer to FIG. 4) is disposed on a side wall W4 opposite to the side wall W3 to accommodate a part of the connecting assembly 300. The rear receiving portion 212 and the rear accommodating portion 211 are communicated by a through hole H2.

Refer to FIGS. 2 and 3. The connecting assembly 300 includes an engaging element 310, at least one elastic element 320, a pressing element 330, and a fixing element 340. The engaging element 310 includes a second fan-shaped portion F2, a mating portion 311, and a through hole H3. The second fan-shaped portion F2 includes a plurality of second teeth T2. In more detail, there is a gap G between each of the plurality of second teeth T2 and the adjacent one, and the plurality of second teeth T2 are arranged to form a second fan-shaped portion F2. When viewed along the first direction D1, the mating portion 311 has a circular shape and may be partially accommodated in the front accommodating portion 111, and the through hole H3 penetrates the mating portion 311 in the first direction D1. On the other hand, the plurality of first teeth T1 may be inserted into the gaps G between the plurality of second teeth T2 to be engaged with each other.

The first fan-shaped portion F1 has a first angle θ1, the second fan-shaped portion F2 has a second angle θ2, and the second angle θ2 is greater than the first angle θ1. In some embodiments, the second angle θ2 is twice the first angle θ1. For example, the second angle θ2 is 40 degrees, and the first angle θ1 is 20 degrees. With such an angular configuration, the front assembly 100 may be rotated 20 degrees relative to the rear assembly 200 (operation of the rotation will be described in detail below). However, the first angle θ1 and the second angle θ2 are not limited to this, and may be adjusted according to the requirements of the rotation range.

Refer to FIGS. 2 and 4. The elastic element 320 may be a compression spring. In this embodiment, there are two elastic elements 320, disposed on the rear accommodating portion 211 and extended parallel to the first direction D1, and connected the engaging element 310 and the rear assembly 200.

In more detail, one of the elastic elements 320 is connected to the second fan-shaped portion F2 (opposite to the second tooth T2) of the engaging element 310 and the rear assembly 200, and the other elastic element 320 is connected to the mating portion 311 of the engaging element 310 and the rear assembly 200. A force of the elastic element 320 presses the engaging element 310, so that the second fan-shaped portion F2 of the engaging element 310 may be tightly engaged with the first fan-shaped portion F1 of the front assembly 100. In this embodiment, although two elastic elements 320 of different sizes and lengths are disposed to evenly and surely press the engaging element 310, the number, size, and length of the elastic element 320 is not limited to this, and may be changed according to requirements.

The pressing element 330 may be a round button, which is disposed on the front receiving portion 112, and contacts the engaging element 310 through the through hole H1. The pressing element 330 has a bottom surface S1, and there is a distance d1 between the bottom surface S1 and a bottom surface S2 of the front receiving portion 112. The distance d1 is a depth that the pressing element 330 may be pressed to.

The fixing element 340 may be a screw, and a corresponding thread is disposed on the pressing element 330. Thus, the fixing element 340 may sequentially pass through the through hole H2, the rear accommodating portion 211, and the elastic element 320, the through hole H3 of the engaging element 310, and the front accommodating portion 111 from the rear receiving portion 212 to be locked into the pressing element 330.

Figure 5:
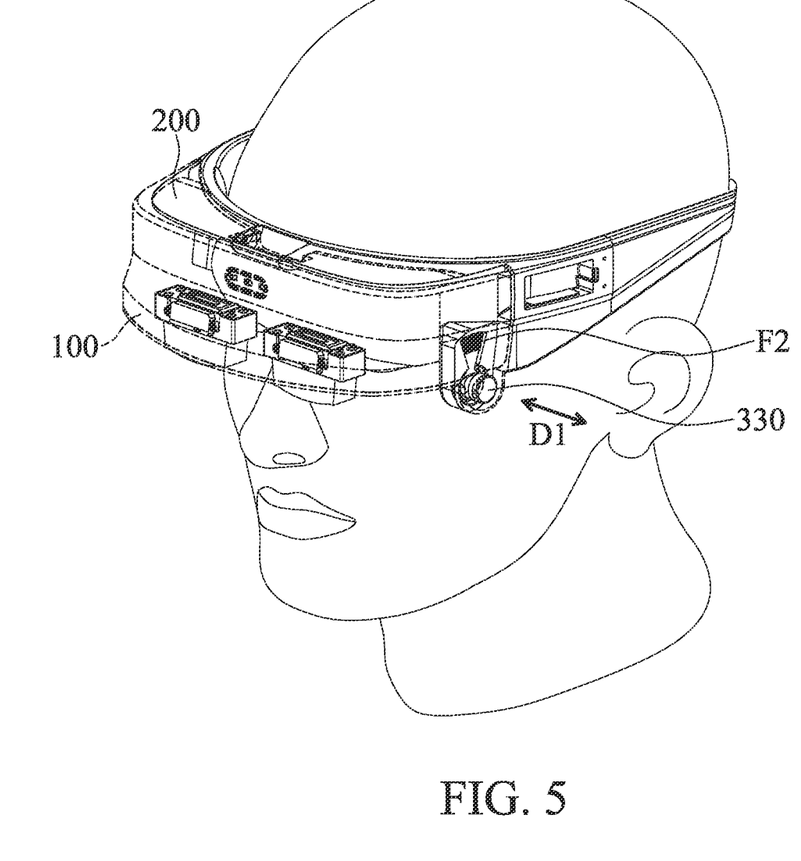
FIG. 5 is a schematic diagram of a wearable device being worn by a user according to an embodiment of the present disclosure.
Figure 6:
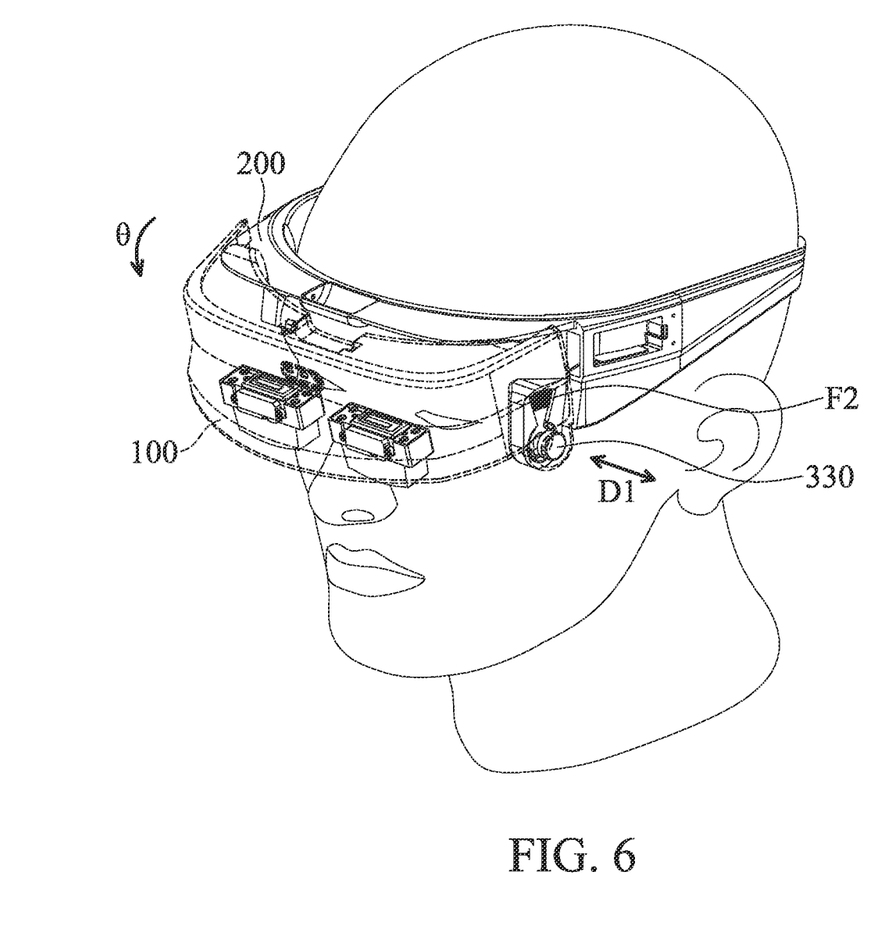
FIG. 6 is a schematic diagram of operating a wearable device according to an embodiment of the present disclosure.
Figure 7:
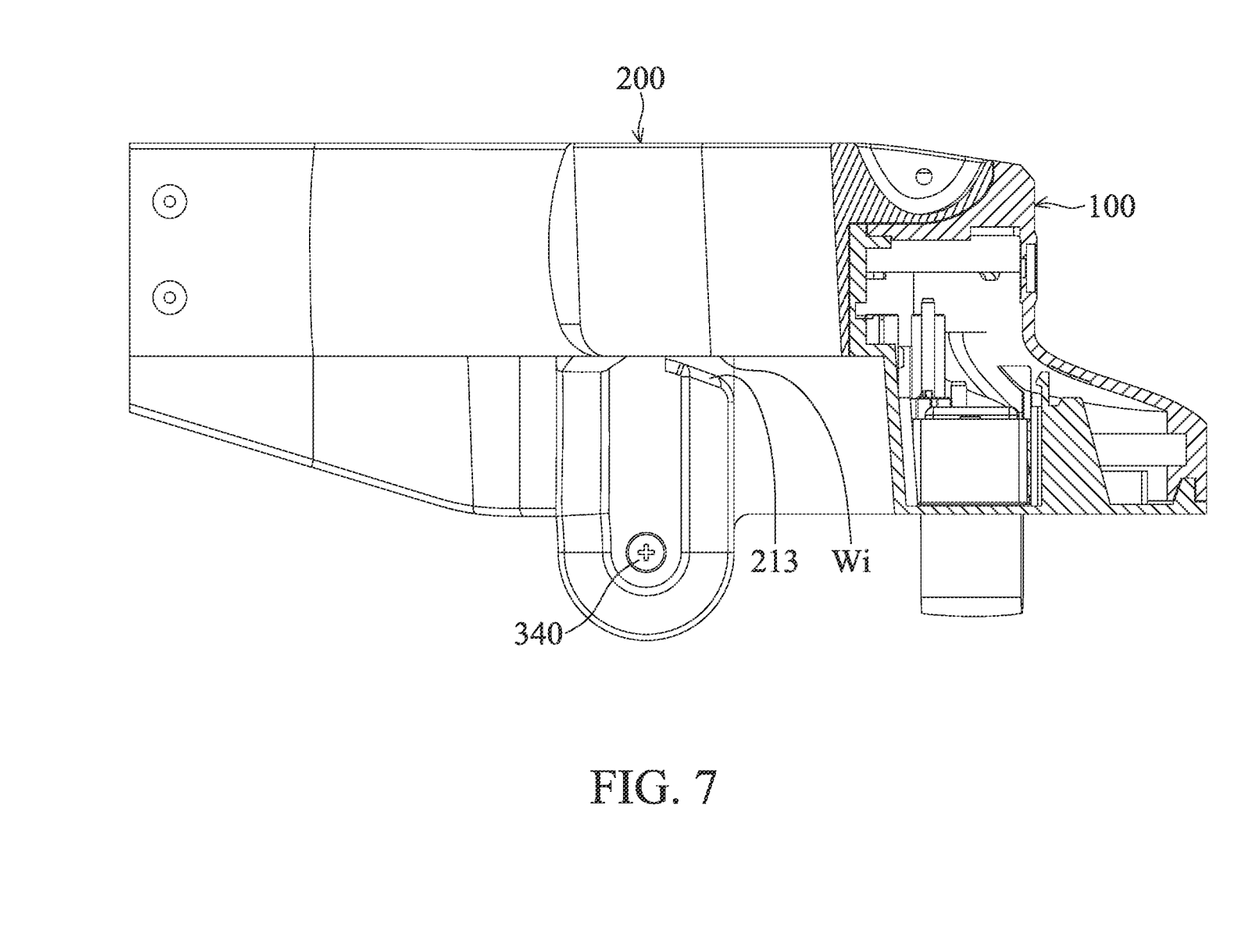
FIG. 7 is a cross-sectional view of a partial structure of the wearable device cut along the line B-B' in FIG. 1.

Refer to FIGS. 4 to 7, and how to operate the wearable device 1 to make it consistent with the user's viewing angle will be explained. FIG. 5 is a schematic diagram of the wearable device 1 being worn by a user according to an embodiment of the present disclosure. FIG. 6 is a schematic diagram of operating the wearable device 1 according to an embodiment of the present disclosure. FIG. 7 is a cross-sectional view of the wearable device 1 cut along the line B-B' in FIG. 1. As shown in FIG. 5, when the user wears the wearable device 1 on his head and looks at the front horizontally, the image capturing portion 120 and the optical machine 130 disposed on the front assembly 100 are consistent with the user's viewing angle. Therefore, the real image obtained by the user's eyes and the virtual image generated by the wearable device 1 are superimposed, and the good augmented reality effect may be achieved.

However, if the user's head does not move or slightly moves while the user's viewing angle is downward, or the user's head moves downward while the user's viewing angle remains at the front horizontally, etc., which may not cause the good augmented reality effect because the real image and the virtual image are not superimposed.

Therefore, for example, as shown in FIGS. 4 and 6, the user may press the pressing element 330 along the first direction D1 with the left hand, so that the fixing element 340 locked to the pressing element 330 moves by the distance d1, and further the engaging element 310 fixed to the fixing element 340 is pressed toward the elastic element 320 along with the fixing element 340. When the first fan-shaped portion F1 of the front assembly 100 and the second fan-shaped portion F2 of the engaging element 310 are not engaged and are in a separated state, the user's right hand may rotate the front assembly 100 downward by an angle θ with the fixing element 340 as the central axis, so that after the real image and the virtual image are superimposed, the left hand releases the pressing element 330, and the force of the elastic element 320 pushes the engaging element 310 back, so that the second fan-shaped portion F2 is engaged with the first fan-shaped portion F1. Then, an adjustment is completed.

As mentioned above, in some embodiments, the second angle θ2 of the second fan-shaped portion F2 may be formed to 40 degrees, and the first angle θ1 of the first fan-shaped portion F1 may be formed to 20 degrees. Under normal circumstances, the first fan-shaped portion F1 is engaged with the second fan-shaped portion F2 in a range of 20 to 40 degrees. When the adjustment is required, the user may rotate the front assembly 100 at most 20 degrees, so that the first fan-shaped portion F1 is engaged with the second fan-shaped portion F2 in a range of 0 to 20 degrees.

Therefore, it can be seen from the above that if the front assembly 100 is rotated beyond the second fan-shaped portion F2 of the engaging element 310, the front assembly 100 and the rear assembly 200 may not be engaged and fixed. That is, the second fan-shaped portion F2 may be used to control a rotation range of the front assembly 100 relative to the rear assembly 200.

In addition, in some embodiments, as shown in FIG. 7, the front assembly 100 may include an inner wall Wi, the rear assembly 200 may include a stopper 213. When the front assembly 100 is rotated with the fixing element 340 extending alone the first direction D1 as the central axis, the front assembly 100 may stop rotating while the inner wall Wi contacts the stopper 213, which may further limit the rotation range of the front assembly 100 relative to the rear assembly 200 to avoid excessive rotation.

In summary, the present disclosure provides a wearable device that is worn on a user's head and includes a front assembly, a rear assembly, and a connecting assembly. The connecting assembly connects the front assembly and the rear assembly, wherein the front assembly is rotatable to an angle relative to the rear assembly via the connecting assembly. With the wearable device of the present disclosure, the user can simply adjust the relative angle between the user's viewing angle and the optical module, so that the virtual image and the real image are superimposed to achieve a good augmented reality effect.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein can be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A wearable device, worn on a user's head, comprising:
a front assembly;
a rear assembly; and
a connecting assembly, connecting the front assembly and the rear assembly,
wherein the front assembly is rotatable to an angle relative to the rear assembly via the connecting assembly;
wherein the front assembly comprises a first fan-shaped portion, the connecting assembly comprises an engaging element, the engaging element comprises a second fan-shaped portion, the engaging element and the first fan-shaped portion are engaged with each other, the first fan-shaped portion has a first angle, the second fan-shaped portion has a second angle, and the first angle is smaller than the second angle.

2. The wearable device as claimed in claim 1, wherein the front assembly has a plurality of first teeth, the first teeth are arranged to form the first fan-shaped portion, wherein the engaging element has a plurality of second teeth, the second teeth are arranged to form the second fan-shaped portion, and the first teeth are inserted into gaps between the second teeth to be engaged with each other.

3. The wearable device as claimed in claim 1, wherein the second angle is twice the first angle.

4. The optical element driving mechanism as claimed in claim 1, wherein when viewed in a direction that is perpendicular to the optical axis, the first driving assembly partially overlaps the second driving assembly.

5. The wearable device as claimed in claim 4, wherein the connecting assembly further comprises at least one elastic element, disposed on the rear accommodating portion, connecting the engaging element and the rear assembly.

6. The wearable device as claimed in claim 5, wherein the connecting assembly further comprises a pressing element, and the front assembly further comprises a front receiving portion, wherein the front receiving portion and the front accommodating portion are communicated by a through hole, and the pressing element is disposed on the front receiving portion.

7. The wearable device as claimed in claim 6, wherein the connecting assembly further comprises a fixing element, wherein the rear assembly further comprises a rear receiving portion, and the fixing element sequentially passes through the rear accommodating portion, the elastic element, the engaging element, and the front accommodating portion to be locked into the pressing element.

8. The wearable device as claimed in claim 1, wherein the front assembly comprises an inner wall and the rear assembly comprises a stopper.

\* \* \* \* \*